(12) United States Patent
Chow et al.

(10) Patent No.: US 8,272,898 B2
(45) Date of Patent: Sep. 25, 2012

(54) ELECTRICAL CONNECTOR SYSTEM WITH MAGNETIC MODULE

(75) Inventors: John Chow, Saratoga, CA (US); Li-Chun Wu, Tu-Cheng (TW); Chao-Tung Huang, Tu-Cheng (TW); Chih-Min Lin, Tu-Cheng (TW); Jie Zhang, Kunshan (CN); Yong-Chun Xu, Kunshan (CN)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 458 days.

(21) Appl. No.: 12/508,792

(22) Filed: Jul. 24, 2009

(65) Prior Publication Data

US 2010/0022133 A1    Jan. 28, 2010

(30) Foreign Application Priority Data

Jul. 24, 2008  (CN) .......................... 2008 2 0039111
Sep. 10, 2008  (CN) .......................... 2008 1 0304438
Sep. 10, 2008  (CN) .......................... 2008 1 0304444

(51) Int. Cl.
  *H01R 13/66*  (2006.01)
(52) U.S. Cl. ................ 439/620.15; 439/540.1

(58) Field of Classification Search .................. 439/502, 439/620.05–620.07, 620.09, 620.18, 620.13, 439/540.1, 607.23
See application file for complete search history.

(56) References Cited

U.S. PATENT DOCUMENTS

| 4,196,957 | A  | * | 4/1980  | Benasutti ....................... 439/682 |
| 5,587,884 | A  | * | 12/1996 | Raman .......................... 361/728 |
| 7,241,181 | B2 | * | 7/2007  | Machado et al. ............. 439/676 |
| 7,445,507 | B1 | * | 11/2008 | Parker ...................... 439/620.18 |
| 7,661,994 | B2 | * | 2/2010  | Machado et al. ............. 439/676 |

* cited by examiner

*Primary Examiner* — Tulsidas C Patel
*Assistant Examiner* — Travis Chambers
(74) *Attorney, Agent, or Firm* — Wei Te Chung; Andrew C. Cheng; Ming Chieh Chang

(57) ABSTRACT

An electrical connector system includes a substrate (1) connected to PHY side and an electrical connector (3) mounted on the substrate (1), a transformer (5) and a common mode filter (7). The electrical connector (3) is used to mate with a cable assembly and so forms a Cable side. The transformer (5) further includes a first wire (51) having two opposite ends electrically connected to the PHY side and a second wire (53) having two opposite ends. The common mode filter (7) has a third wire (73) and a fourth wire (75) that are physically separated from and electrically connected to opposite ends of the second wire (53).

15 Claims, 20 Drawing Sheets

ELECTRICAL CONNECTOR SYSTEM WITH MAGNETIC MODULE

CROSS-REFERENCE TO RELATED APPLICATIONS

This patent application is related to a pending U.S. patent application Ser. No. 12/319,299, filed on Jan. 5, 2008, published in Document No. 2009 0176408 A1 on Jul. 9, 2009, and entitled "ELECTRICAL CONNECTOR HAVING AN IMPROVED MAGNETIC MODULE", which is assigned to the same assignee with this application. This patent application is also related to a pending U.S. patent application Ser. No. 12/321,470, filed on Jan. 20, 2008, and entitled "ELECTRICAL CONNECTOR WITH MAGNETIC MODULE", which is assigned to the same assignee with this application.

BACKGROUND OF THE INVENTION

1. Field of the Invention

The present invention relates to an electrical connector system, and more particularly, to an electrical connector system having magnetic module for noise-filtering.

2. Description of the Prior Art

Magnetic elements, including transformer and common mode filter, are often used in noise-filtering in the high frequency field. An electrical connector system having magnetic modules with more effective noise filtering, smaller size and lower cost is always a focus of the designers of the field.

OBJECTS OF THE INVENTION

A main object of the present invention is to provide an electrical connector system having transformer and common mode filter which is convenient to be manufactured and assembled.

The present invention provides an electrical connector system used for a network interface, said network interface providing signal channels between a first side and a second side. The electrical connector system comprising a substrate forming a plurality of conductive traces, an electrical connector mounted on the substrate; a transformer having a first wire having two opposite ends electrically connected to said first side and a second wire having two opposite ends, a common mode filter having a third wire and a fourth wire that are physically separated from the second wire, wherein the third wire has an end electrically connected to one end of the second wire and an opposite end electrical connected to said second side, and wherein the fourth wire has an end electrically connected to the opposite end of the second wire and an opposite end electrical connected to said second side.

The second wire and the third wire and the fourth wire are physically separated from each other, so that the transformer and the common mode filter could be independently manufactured and conveniently assembled.

BRIEF DESCRIPTION OF THE DRAWINGS

The features of this invention which are believed to be novel are set fourth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE INVENTION

Figure 1:
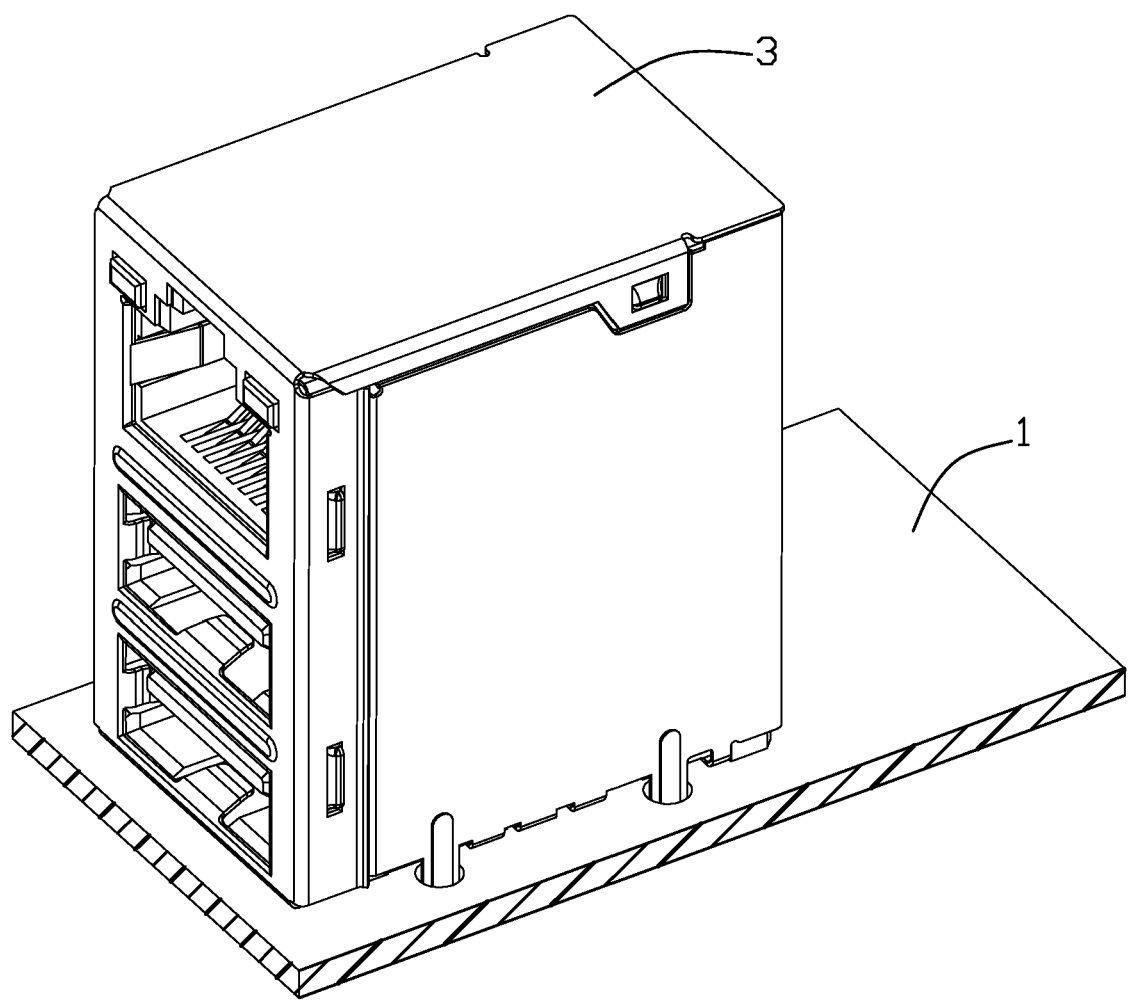
FIG. 1 is a perspective view of an electrical connector system of according to a first embodiment of the present invention.
Figure 2:
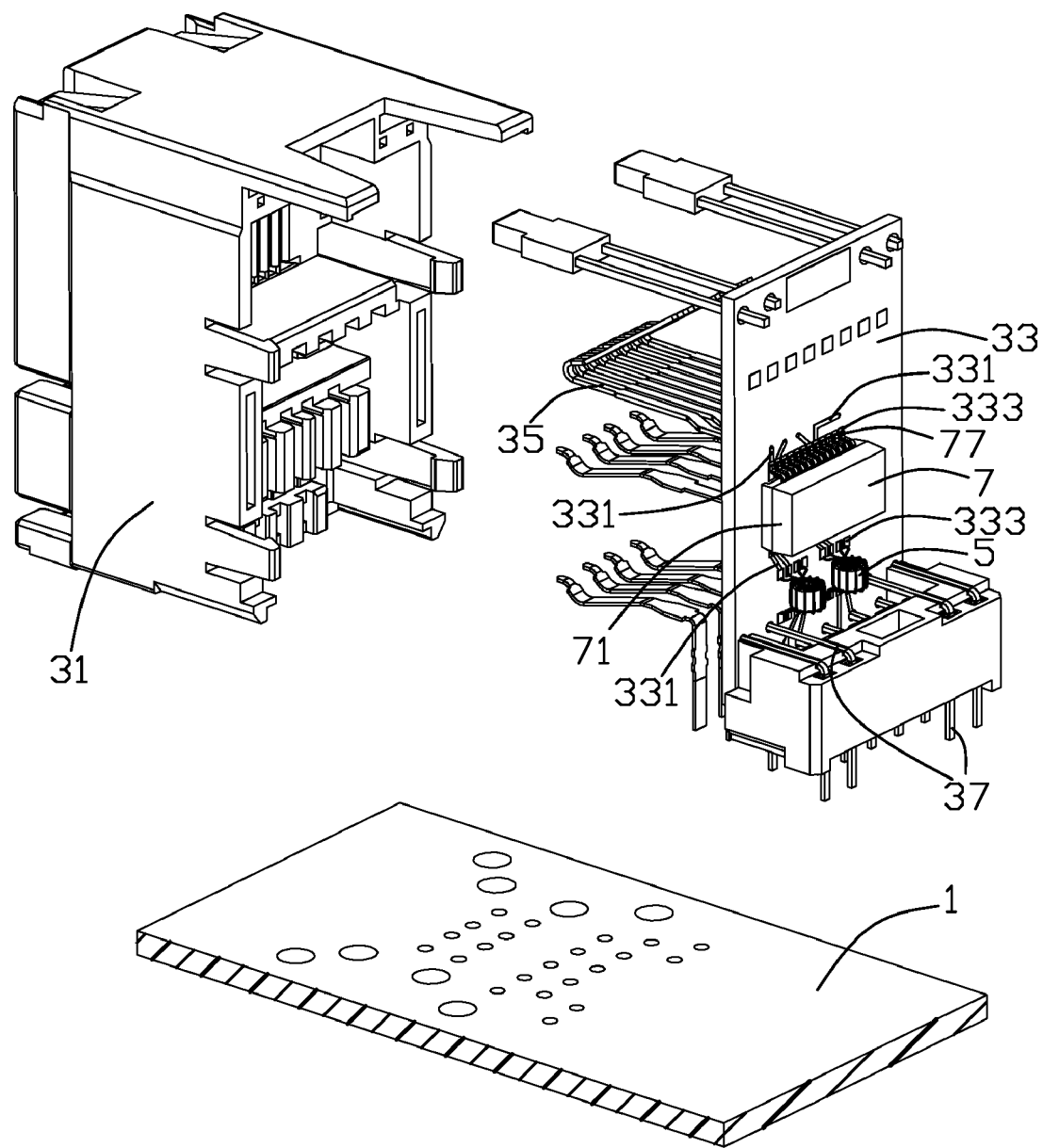
FIG. 2 is an exploded view of the electrical connector system shown in FIG. 1.
Figure 3:
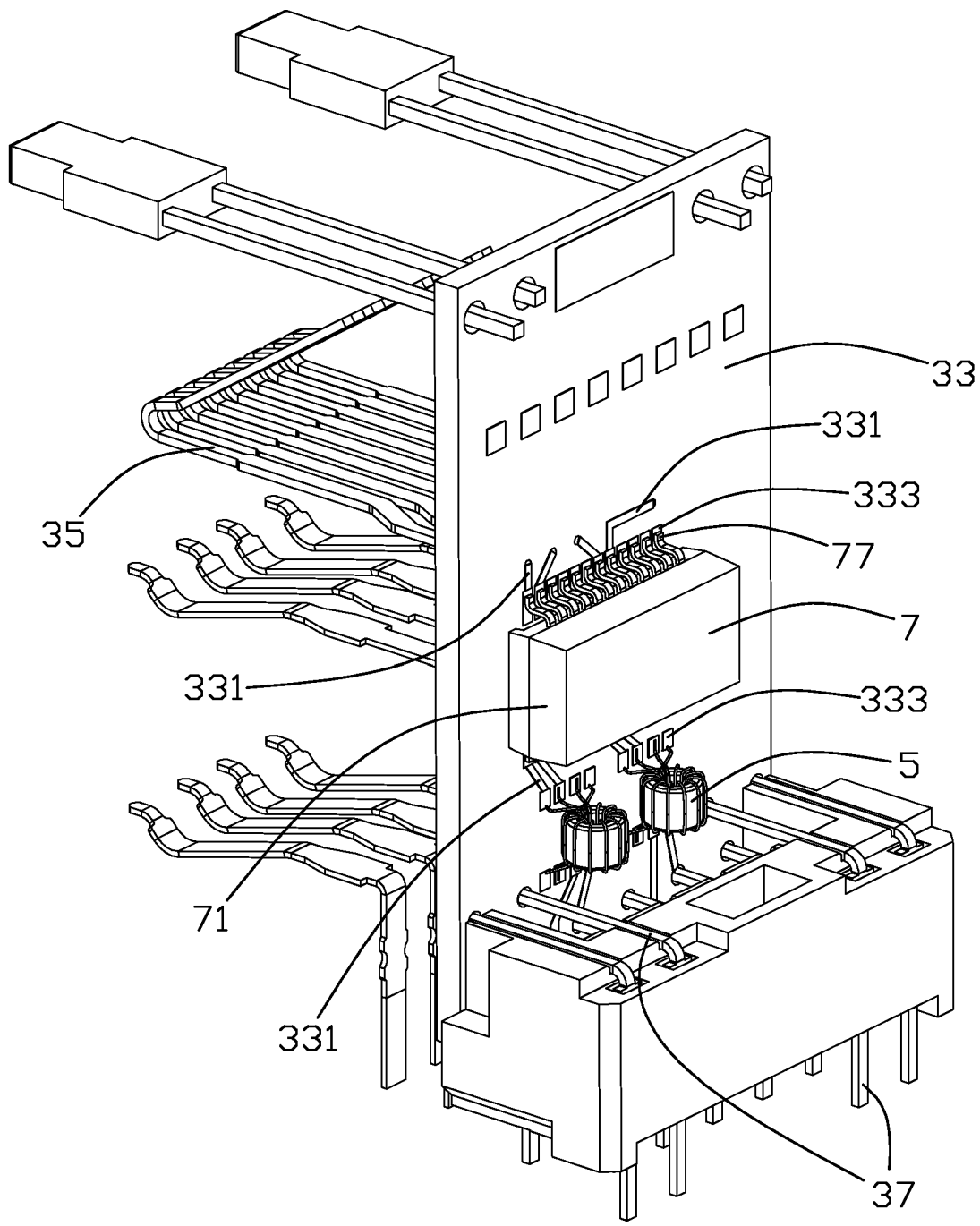
FIG. 3 is a perspective view of a filter portion shown in FIG. 2.

Reference will now be made to the drawing figures to describe the present invention in detail.

FIGS. 1-17 show nine embodiments according to the present invention. The electrical connector system is used for a network interface for 10/100 based Ethernet. The network interface provides signal channels (referring to FIGS. 12A-12D) between a PHY side and a Cable side.

Referring to FIGS. 1-3 and 12A-12C, the electrical connector system comprises a substrate 1 forming a plurality of conductive traces connected to PHY side, an electrical connector 3 mounted on the substrate 1, two transformers 5, and a common mode filter module 7. The electrical connector 3 is used to mate with a cable assembly and so forms a Cable side. The transformer 5 further comprises a first wire 51 having two opposite ends electrically connected to the PHY side and a second wire 53 having two opposite ends. The common mode filter module 7 comprises two common mode filters. Each common mode filter has a third wire 73 and a fourth wire 75 that are physically separated from the second wire 53. The third wire 73 has an end electrically connected to one end of the second wire 53 and an opposite end electrically connected to the Cable side. The fourth wire 75 has an end electrically connected to the opposite end of the second wire 53 and an opposite end electrically connected to the Cable side.

The common mode filter 7 further comprises a plastic container 71, two magnetic cores received in the plastic container 71 and a plurality of conductive tails 77 molded together with the plastic container 71. The third wires 73 and the fourth wires 75 wind around the magnetic cores. The ends of the third and the fourth wires 73, 75 are respectively electrically connected to said conductive tails 77. So, the container 71 makes the common mode filter 7 an integrated common mode module that can be assembled conveniently.

The transformer 5 further comprises a ringy magnetic core and said first and said second wires 51, 53 are wound around the ringy magnetic core.

Figure 12A:
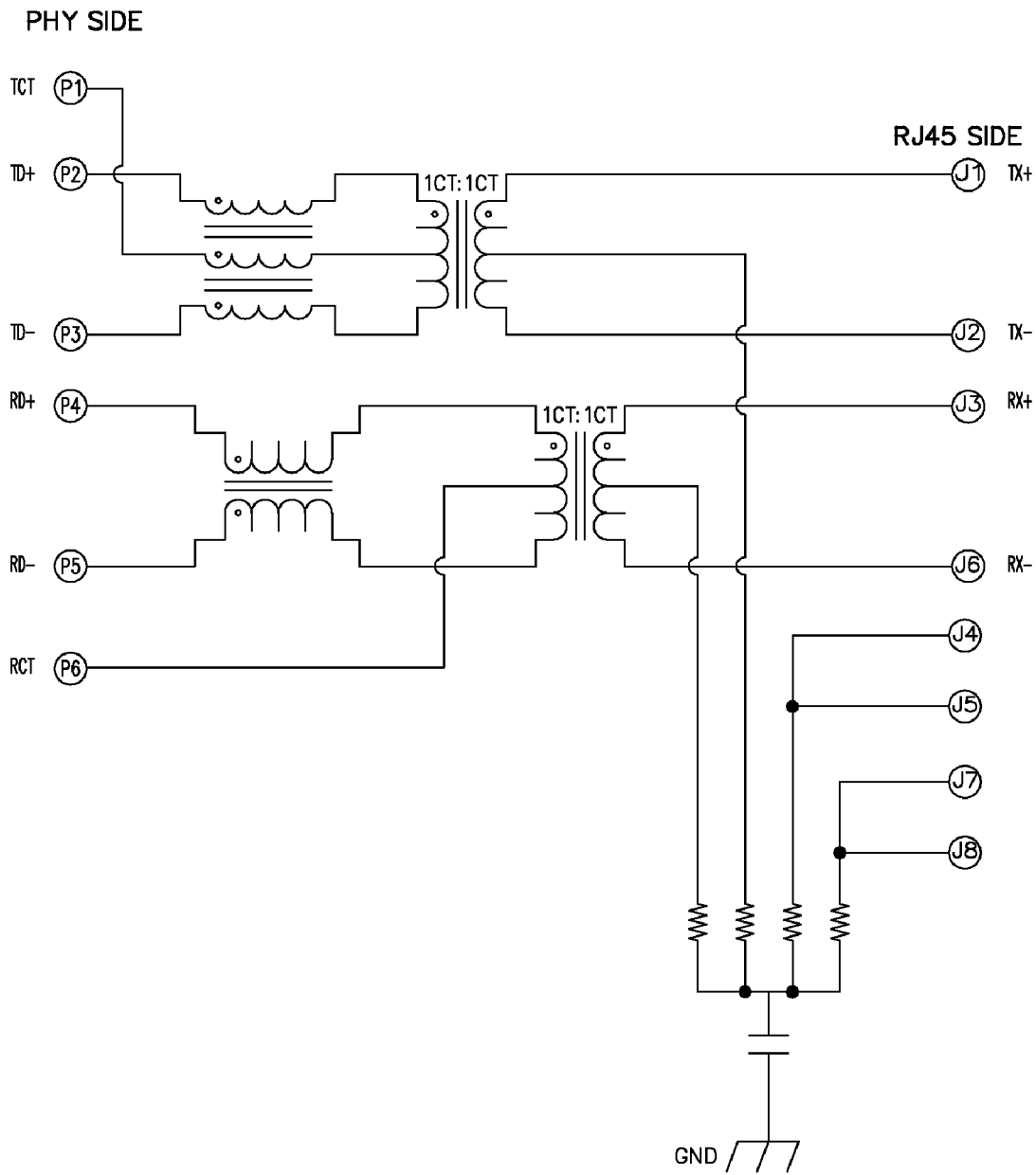
FIG. 12($a$)-12($d$) are circuit diagrams according to present invention.
Figure 12B:
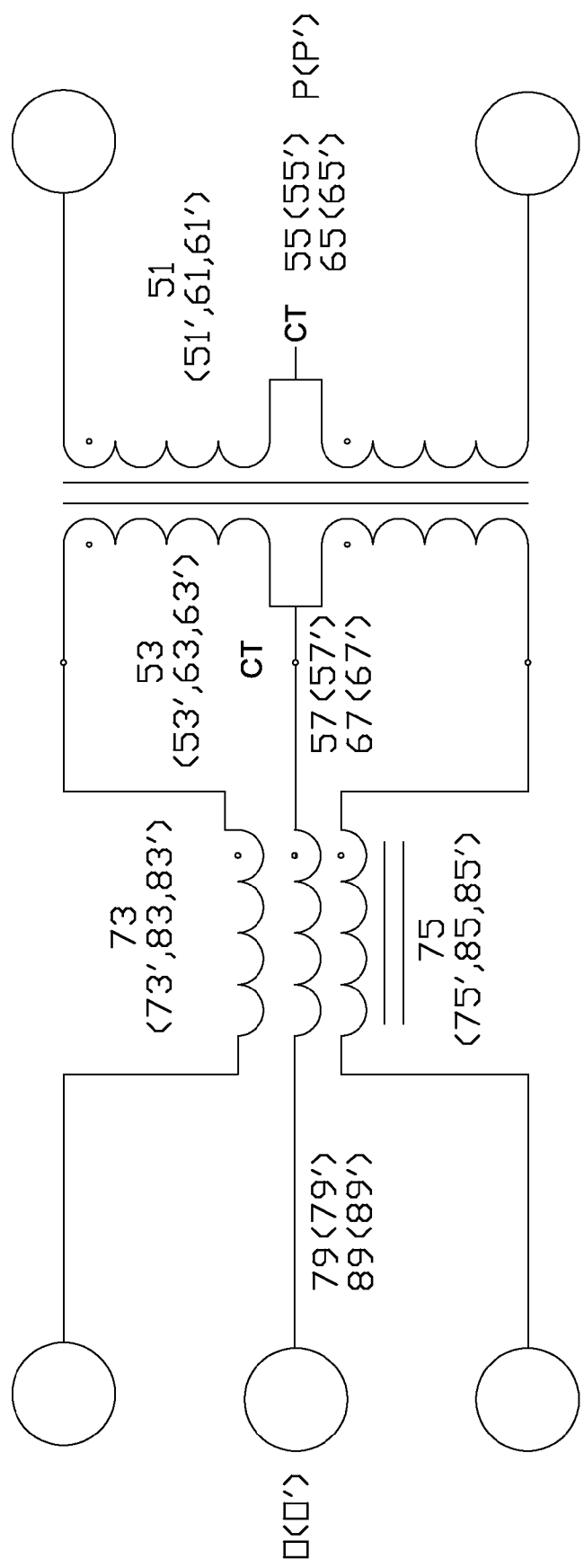
Figure 12C:
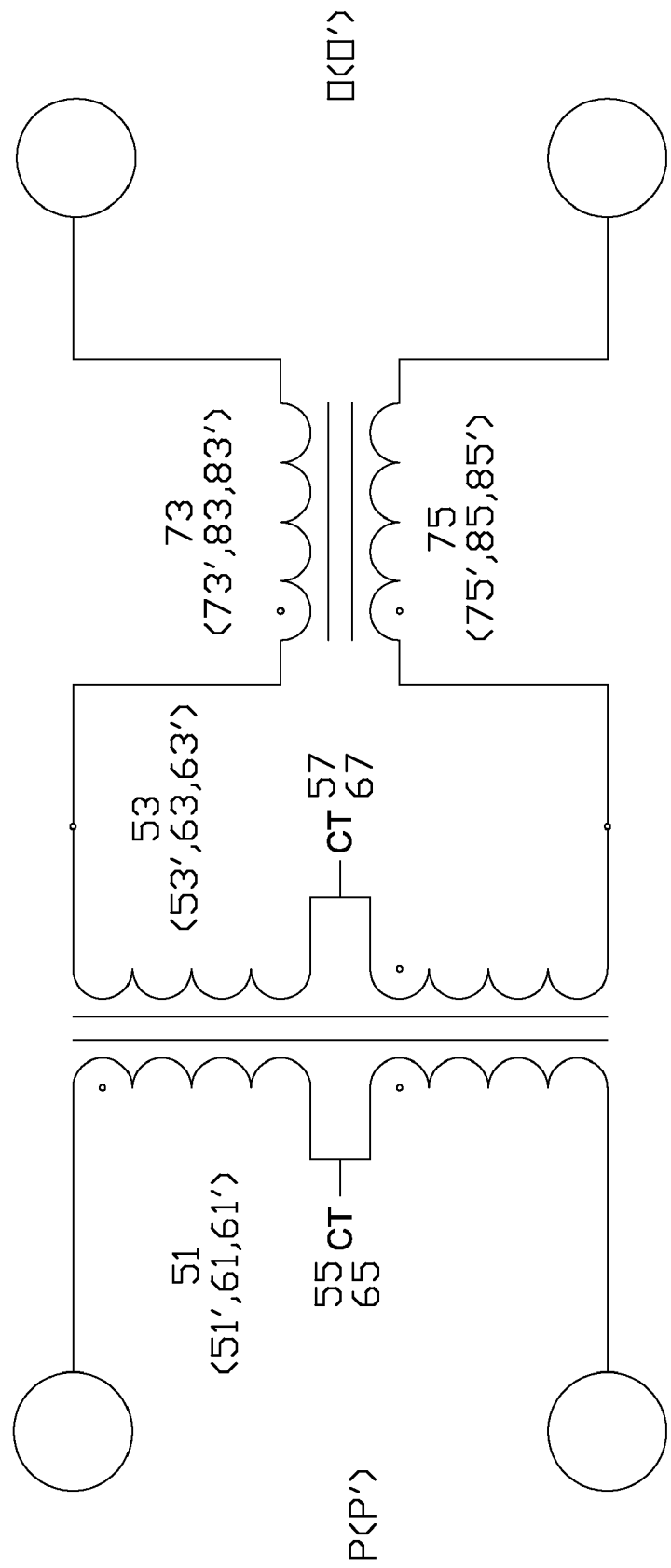

Referring to FIGS. 12A- 12C, circuit diagrams of the network interface are provided. It is shown that each of said first and said second wires 51, 53 forms a center tap 55, 57. In one optional design, the center tap 55 of the first wire 51 is connected to ground, while the common mode module 7 further comprise a fifth wire 79 winding the magnetic core, the center tap 57 of the second wire 53 being electrically connected to ground through the fifth wire 79, which is shown in FIG. 12B. In another optional design, the fifth wire 79 is not provided and the center tap 57 of the second wire is electrically connected to ground directly, which is shown in FIG. 12C. It is the same for other embodiments of the present invention that center taps and a fifth wire may be optionally used to further improve noise filter.

Referring back to FIGS. 2 and 3, the electrical connector 3 further comprises an interior PCB 33, a plurality of mating contacts 35 and a plurality of transferring contacts 37 mounted on the interior PCB. The transformer 5 and the common mode module 7 are mounted on the interior PCB 33. The interior PCB 33 forms a plurality of conductive traces 331 and a plurality of conductive pads 333. The opposite ends of the first wire 51 are electrically connected to the PHY side through some of the conductive traces 331 of the interior PCB 33 and said transferring contacts 37. The opposite ends of the second wire 53 are respectively electrically connected to ends of the third and the fourth wires 73, 75 sequentially through some of the conductive pads 333, some of the conductive trace 331 of the interior PCB 33, some other conductive pads 333, some of the conductive tails 77 and some other of the conductive pads 333. The opposite ends of the third and the fourth wires 73, 75 are electrically connected to the Cable side sequentially through some other of the conductive tails 77, some of the conductive traces 331 of the interior PCB 33 and the mating contacts 35.

Figure 12D:
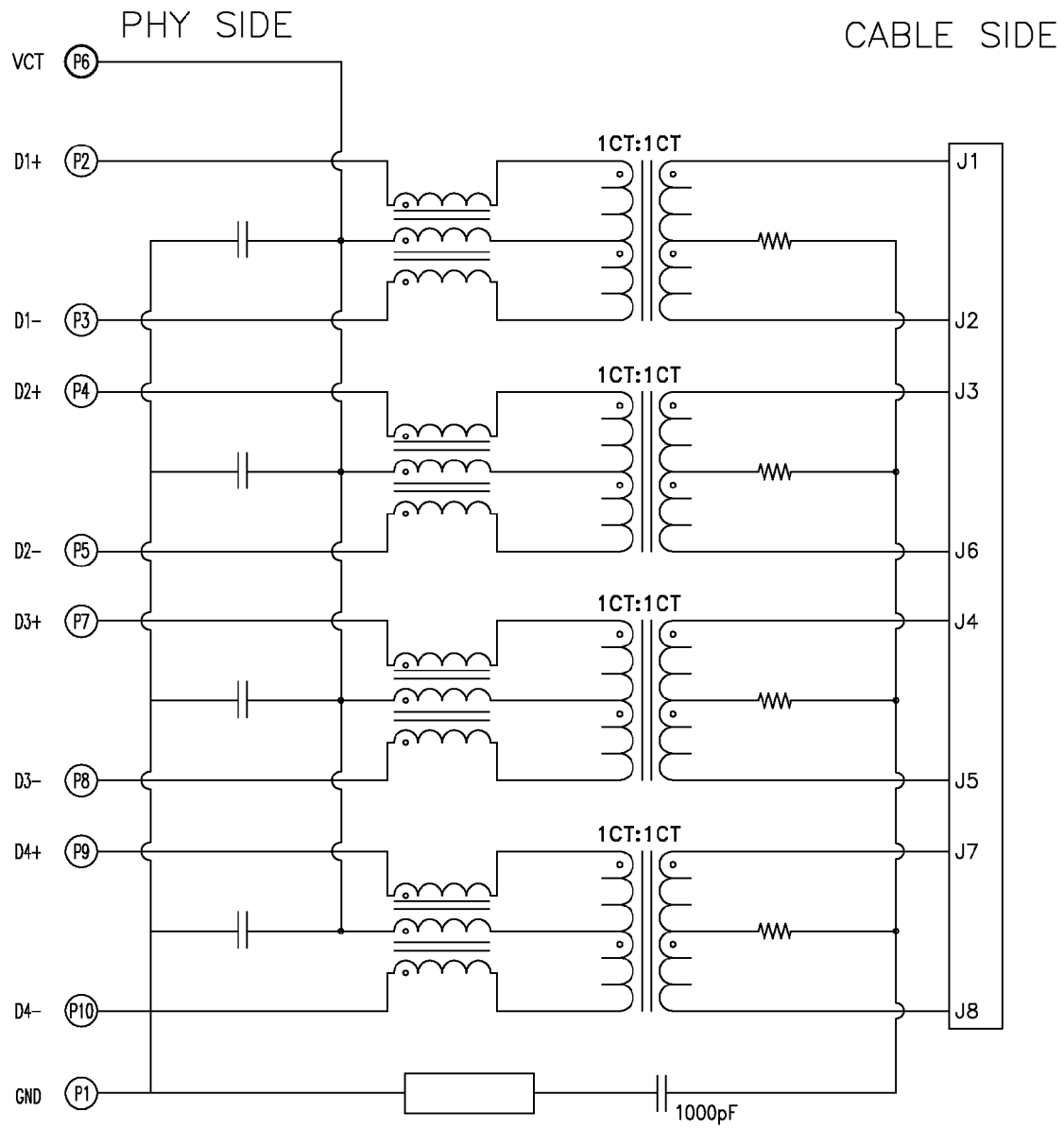
Figure 13:
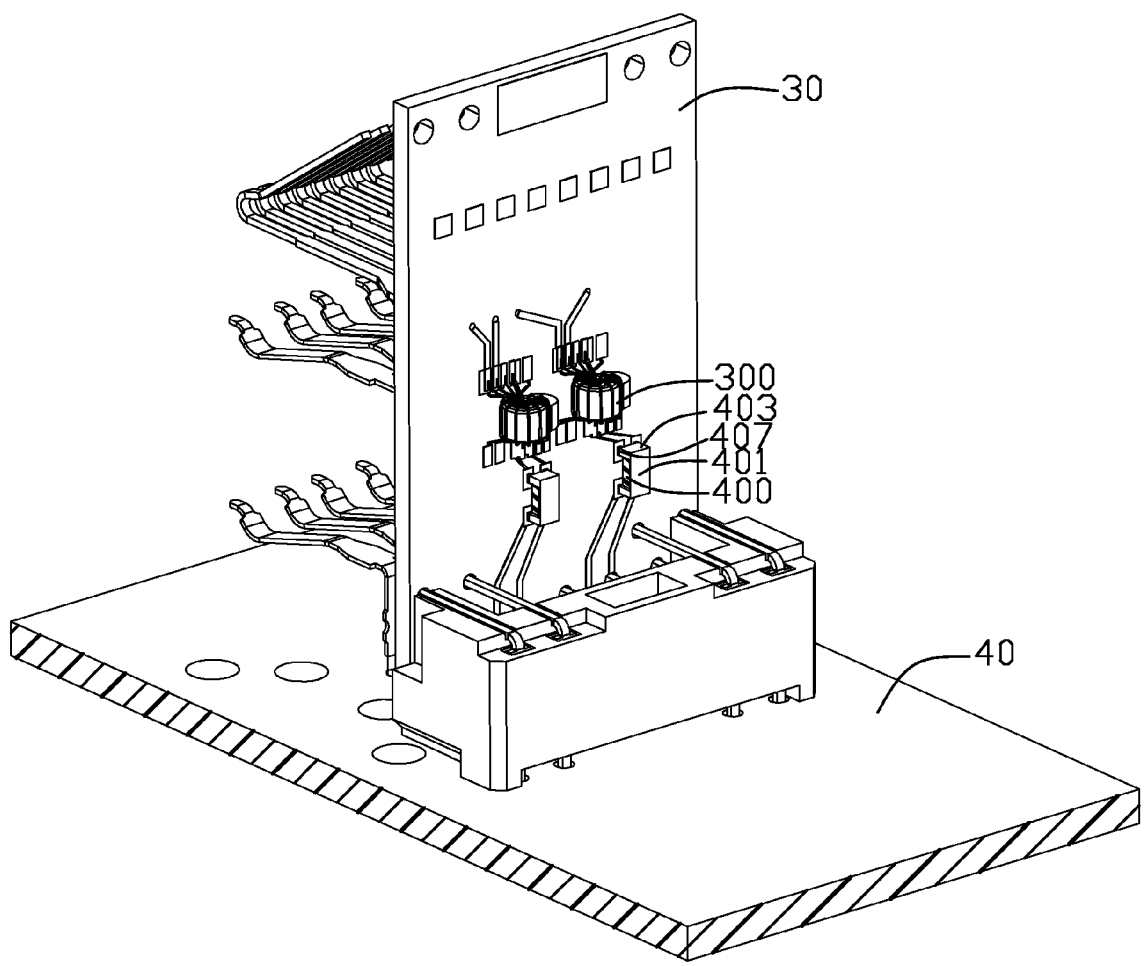
FIG. 13 is a perspective view of a filter portion according to a fifth embodiment of the present invention.
Figure 14:
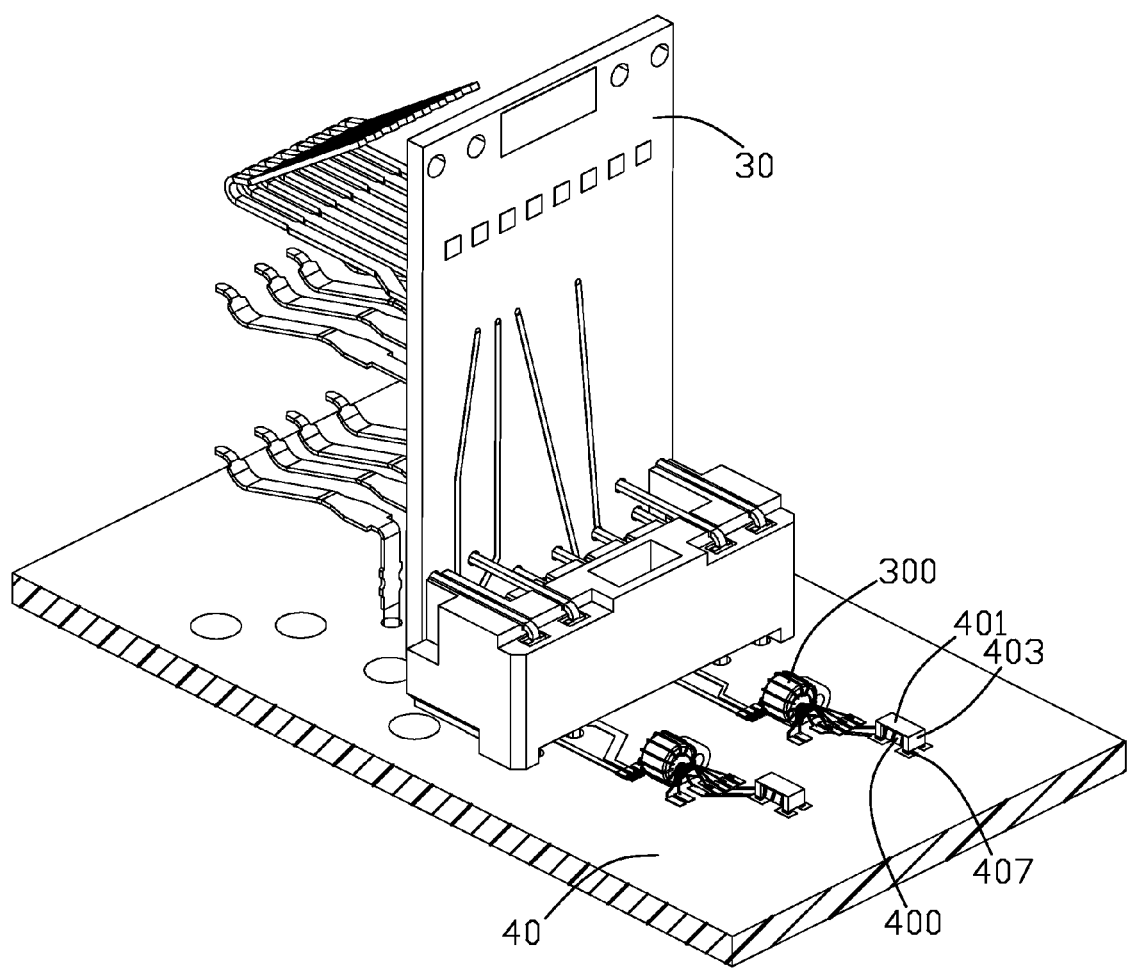
FIG. 14 is a perspective view of a filter portion according to a sixth embodiment of the present invention.
Figure 15:
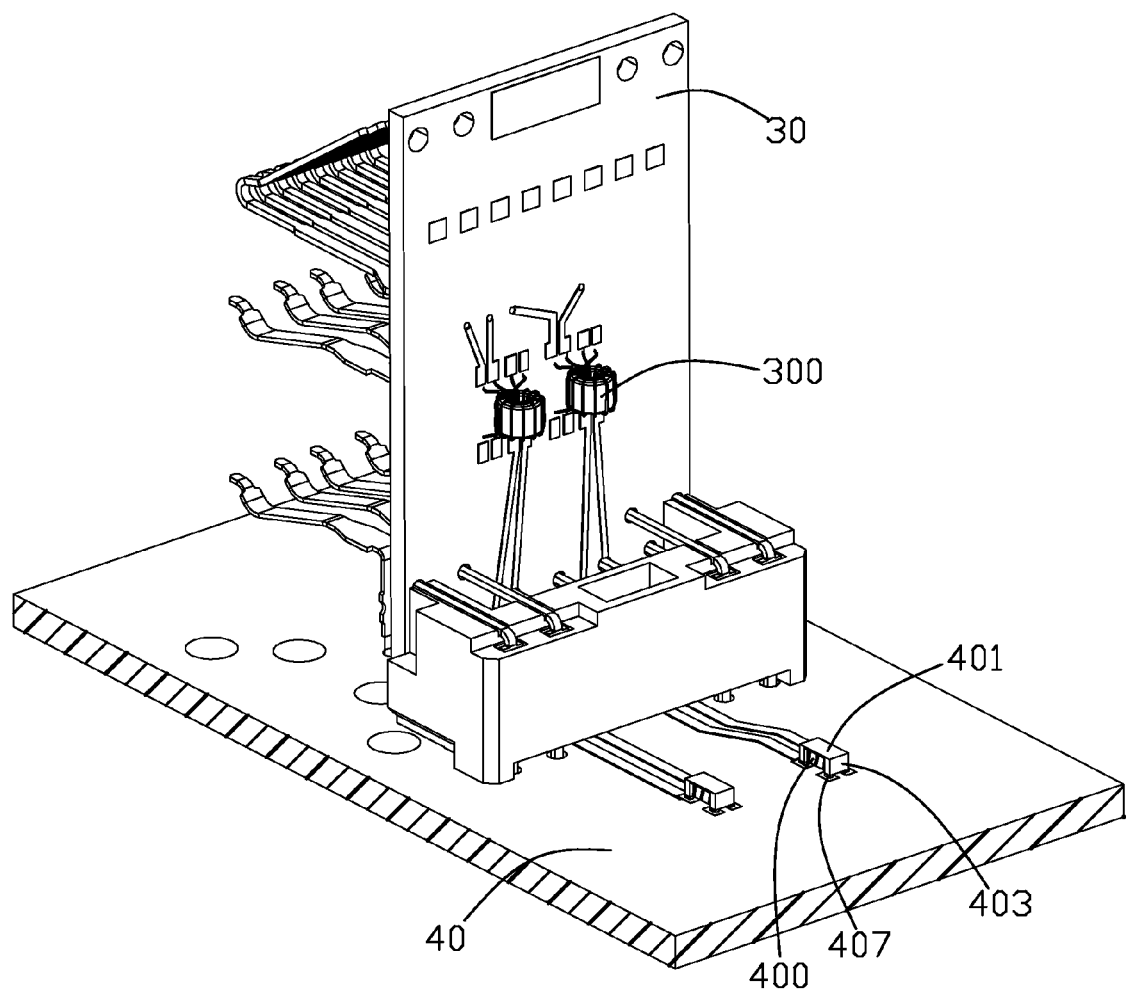
FIG. 15 is a perspective view of a filter portion according to a seventh embodiment of the present invention.
Figure 16:
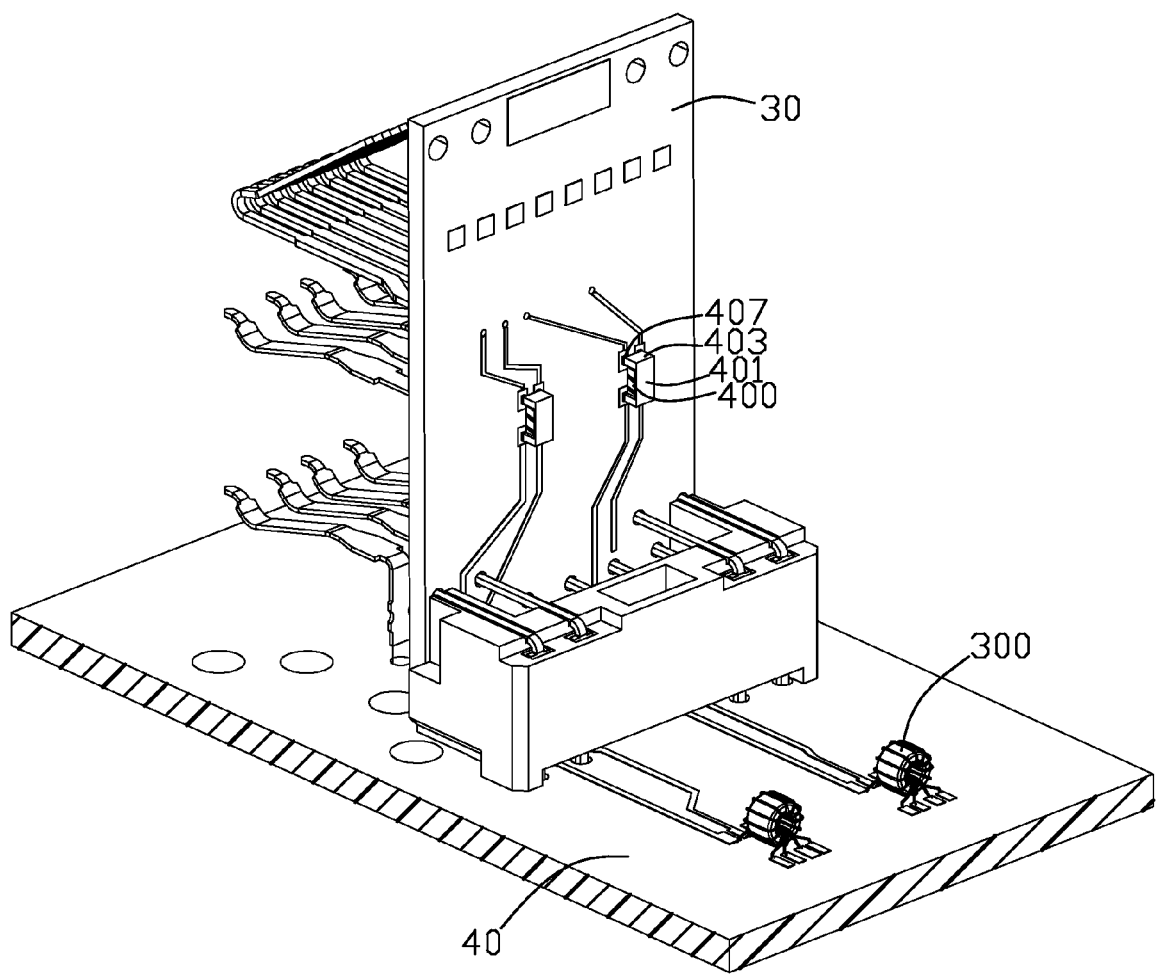
FIG. 16 is a perspective view of a filter portion according to a eighth embodiment of the present invention.

Referring to FIG. 12D, circuit diagram of an electrical connector system in 10-1000 based Ethernet application is shown, which is similar to the circuit diagram of 10/100 based Ethernet application except that there are four signal channels.

Figure 4:
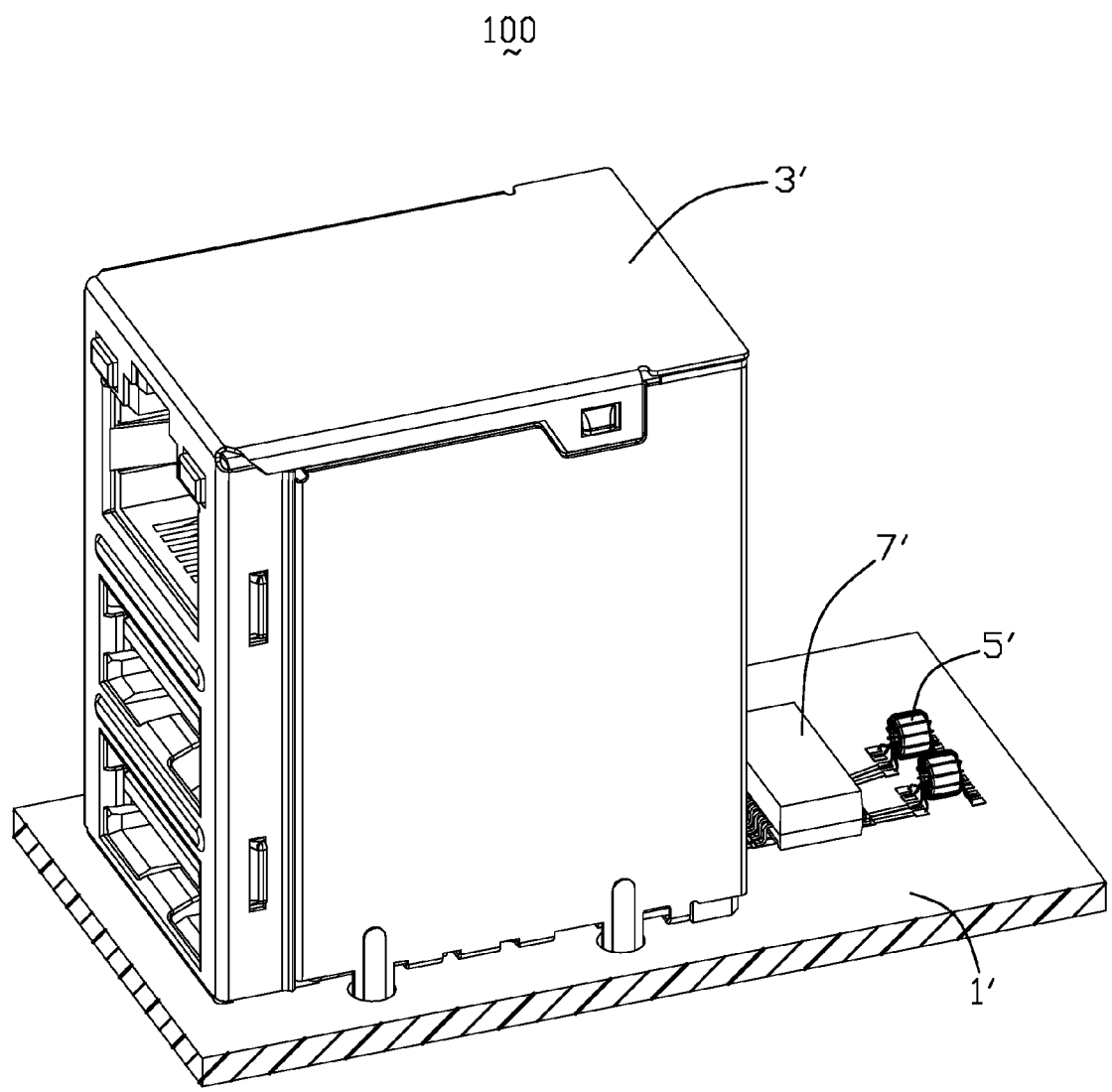
FIG. 4 is a perspective view of an electrical connector system of according to a second embodiment of the present invention.
Figure 5:
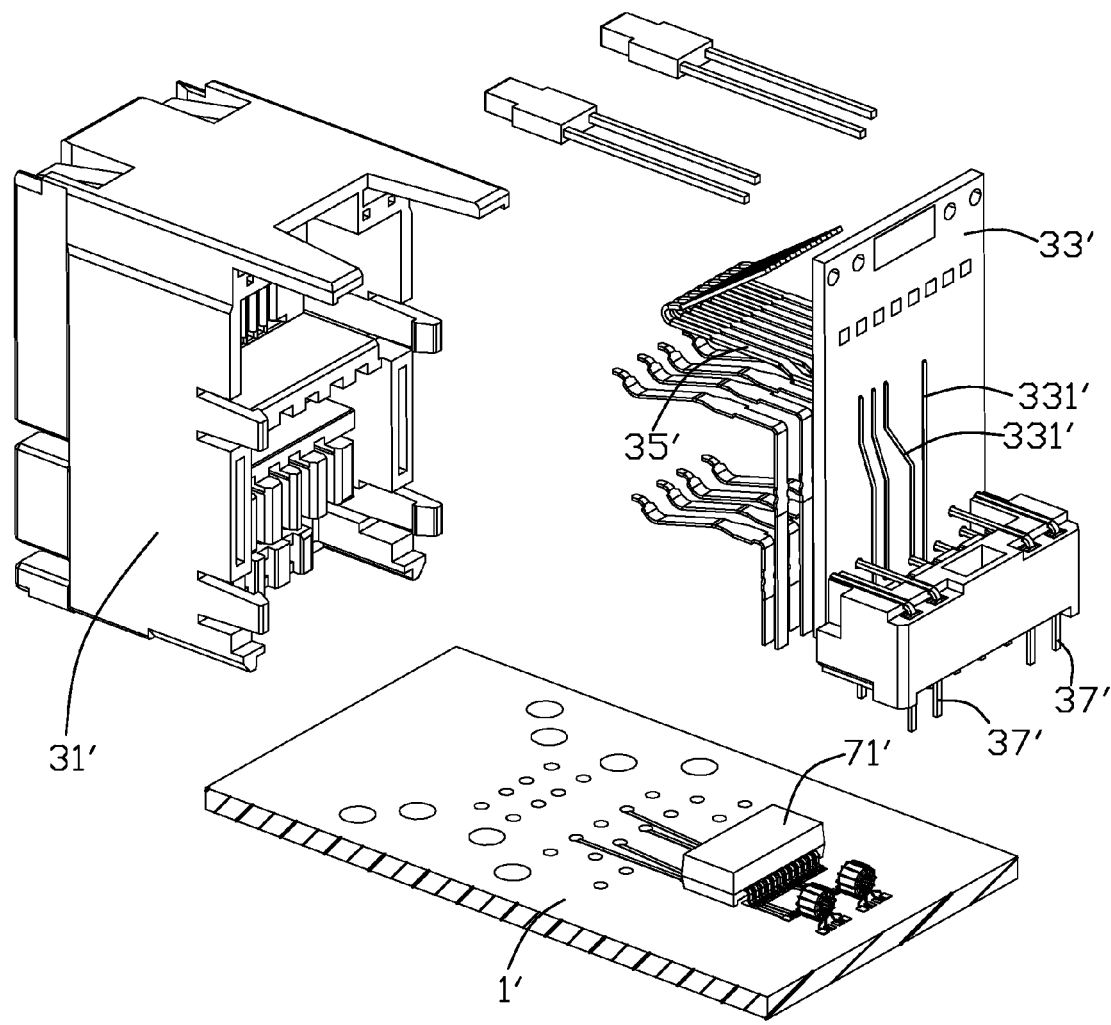
FIG. 5 is an exploded view of the electrical connector system shown in FIG. 4.
Figure 6:
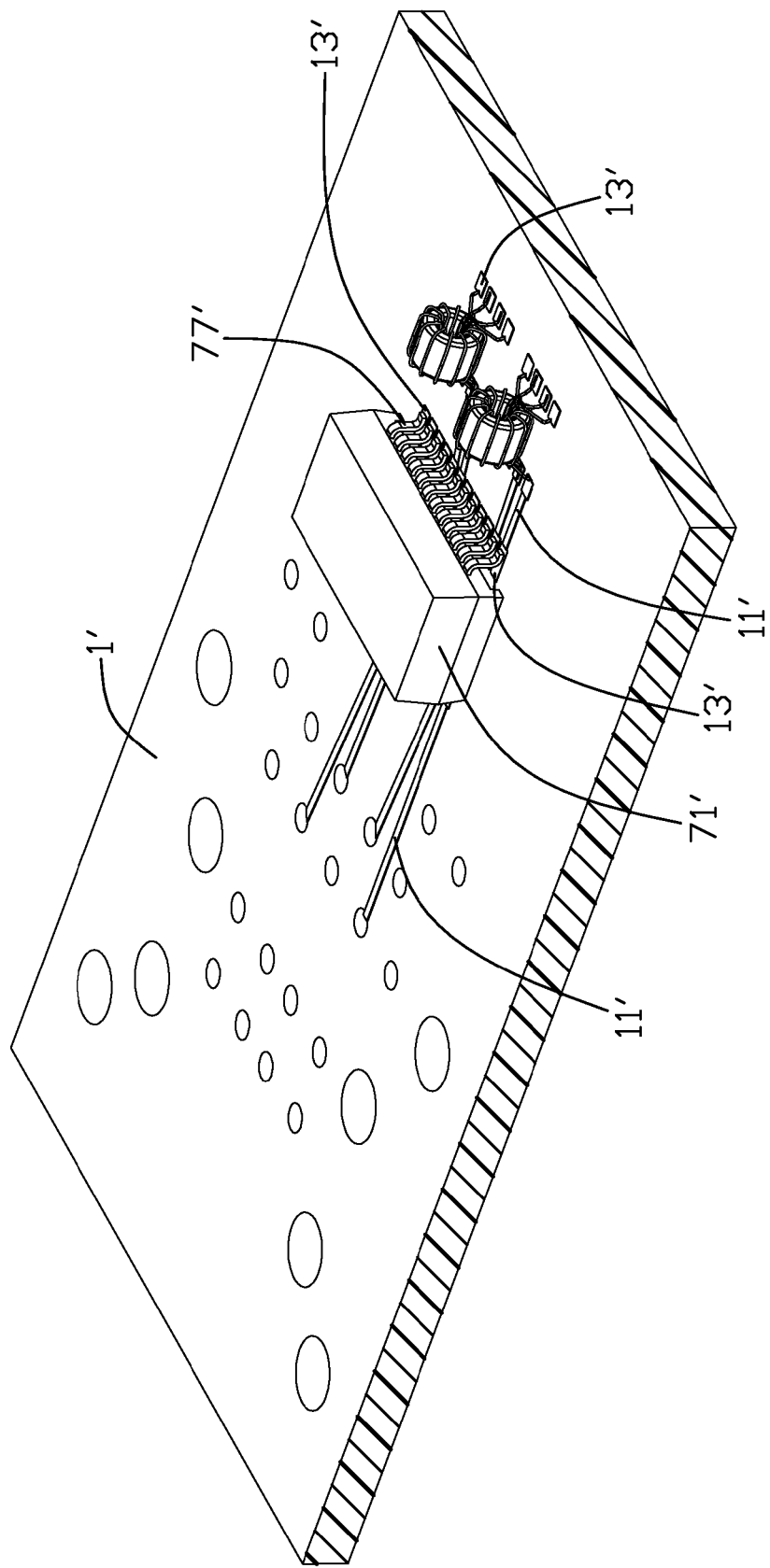
FIG. 6 is a perspective view of a filter portion shown in FIG. 2.

Referring to FIGS. 4-6, an electrical connector system according to a second embodiment of the present invention is shown. The electrical connector system comprises a substrate 1' forming a plurality of conductive traces 11' and an electrical connector 3' mounted on the substrate 1', a transformer 5' and a common mode filter 7'. The transformer 5' further comprises a first wire 51' having two opposite ends electrically connected to the PHY side and a second wire 53' having two opposite ends. The common mode filter 7 has a third wire 73' and a fourth wire 75' that are physically separated from the second wire 53'. The third wire 73' has an end electrically connected to one end of the second wire 53' and an opposite end electrically connected to the Cable side. The fourth wire 75' has an end electrically connected to the opposite end of the second wire 53' and an opposite end electrically connected to the Cable side.

The common mode filter 7' further comprises a plastic container 71', a magnetic core received in the plastic container 71' and a plurality of conductive tails 77' molded together with the plastic container 71'. The third wire 73' and the fourth wire 75' wind around the magnetic core. The ends of the third and the fourth wires 73', 75' are respectively electrically connected to said conductive tails 77'. So, the container 71' makes the common mode filter an integrated common mode module to be assembled conveniently.

Referring to FIGS. 5 and 6, the transformer 5' and the common mode module 7' are mounted on the substrate 1'. The opposite ends of the first wire 51' are electrically connected to the PHY side by some said conductive traces 11' of the substrate 1'. The opposite ends of the second wire 53' are respectively electrically connected to one ends of the third and the fourth wires 73', 75' through some of the conductive pads 13', some of the conductive trace 11' of the substrate 1', some other conductive pads 13', some of the conductive tails 77' and some other of the conductive pads 13'.

The electrical connector 3' further comprises an interior PCB 33'. The interior PCB 33' forms a plurality of conductive traces 331'. The electrical connector 3' further comprises a plurality of mating contacts 35' and a plurality of transferring contacts 37' mounted on the interior PCB. The third and the fourth wires 73', 75' are electrically connected to the Cable side through some conductive tails 77', some conductive traces 11' of the substrate 1', the transferring contacts 37', the conductive traces 331' and the mating contacts 35'.

Figure 7:
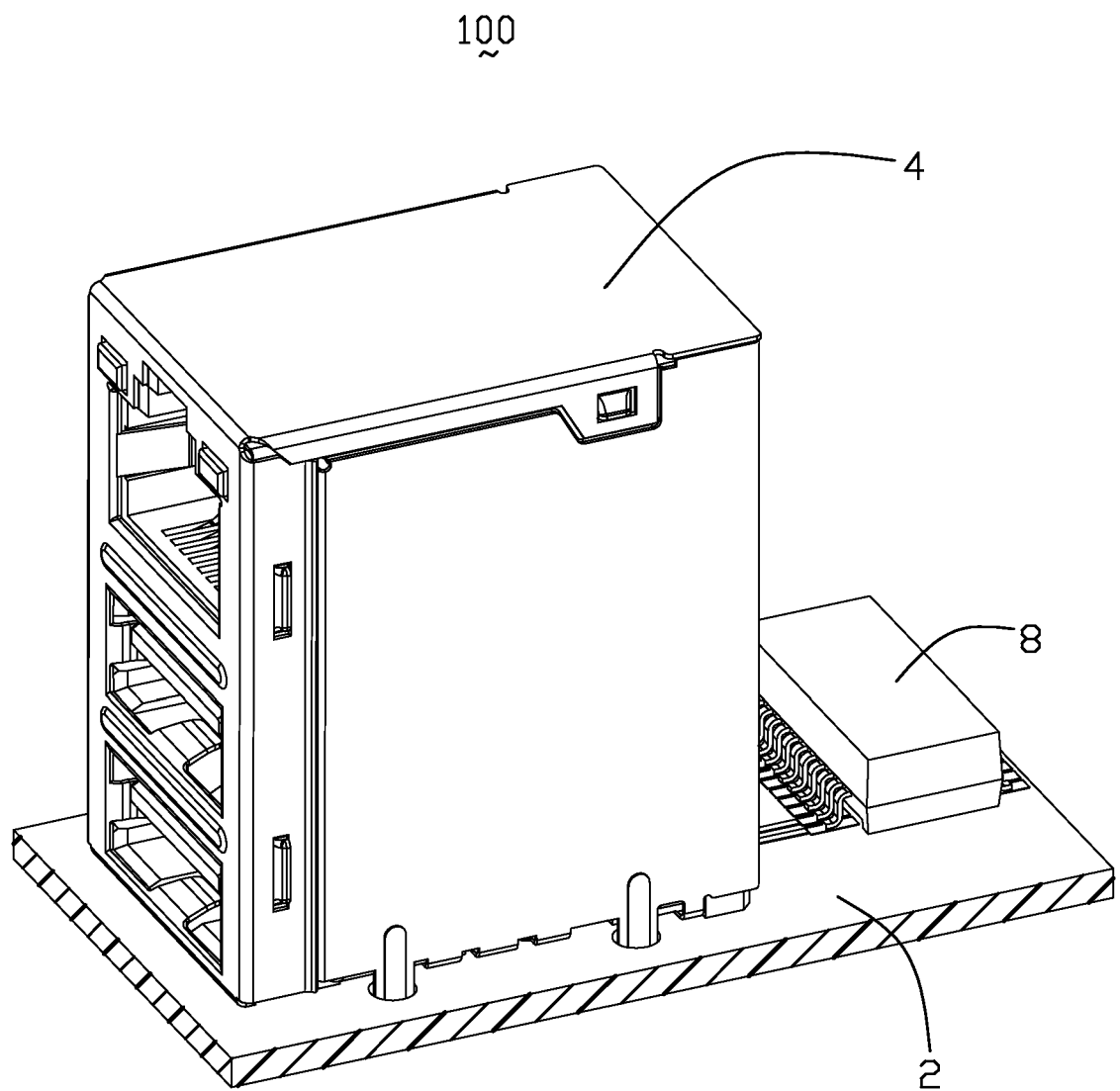
FIG. 7 is a perspective view of an electrical connector system of according to a third embodiment of the present invention.
Figure 8:
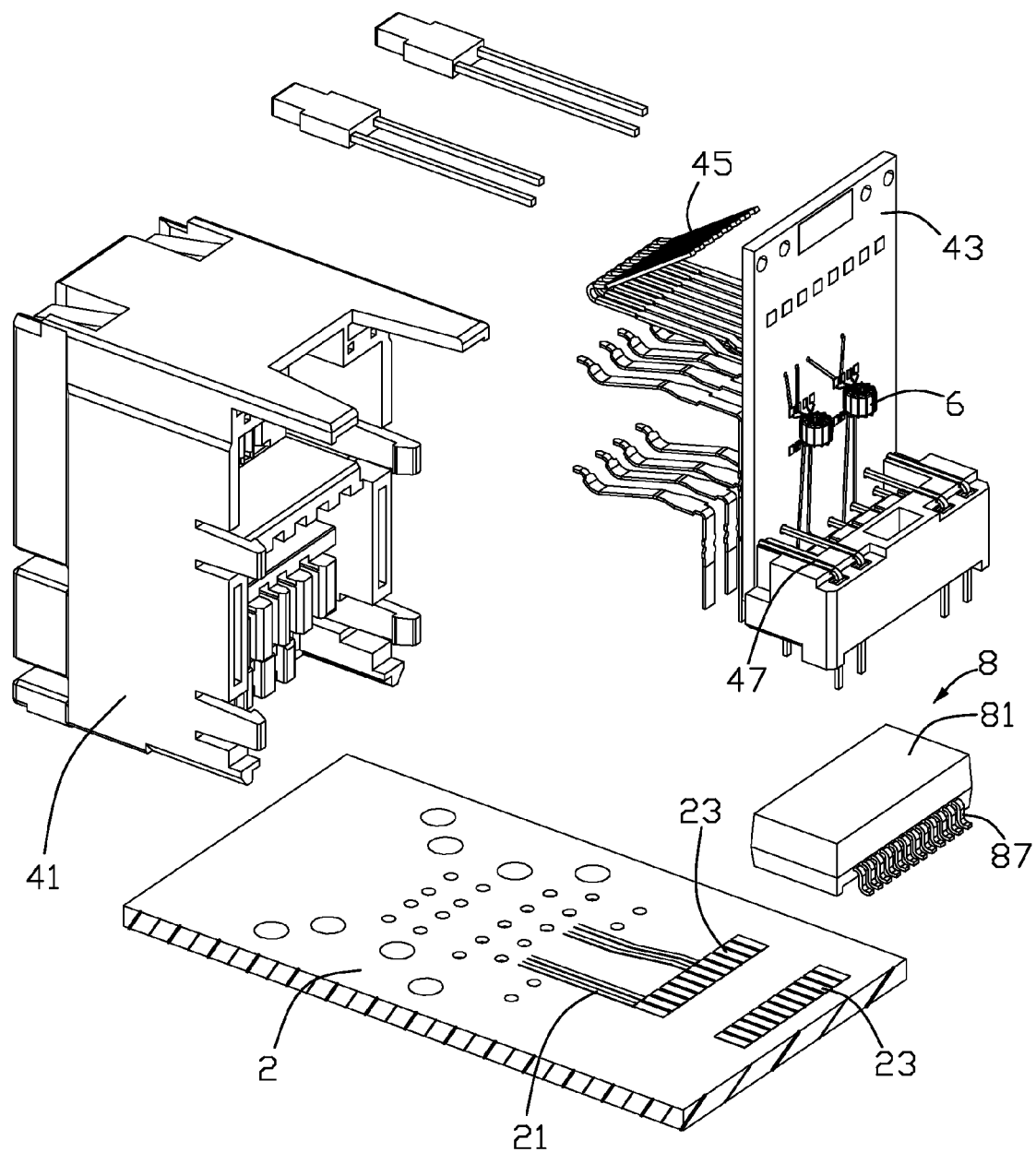
FIG. 8 is an exploded view of the electrical connector system shown in FIG. 7.
Figure 9:
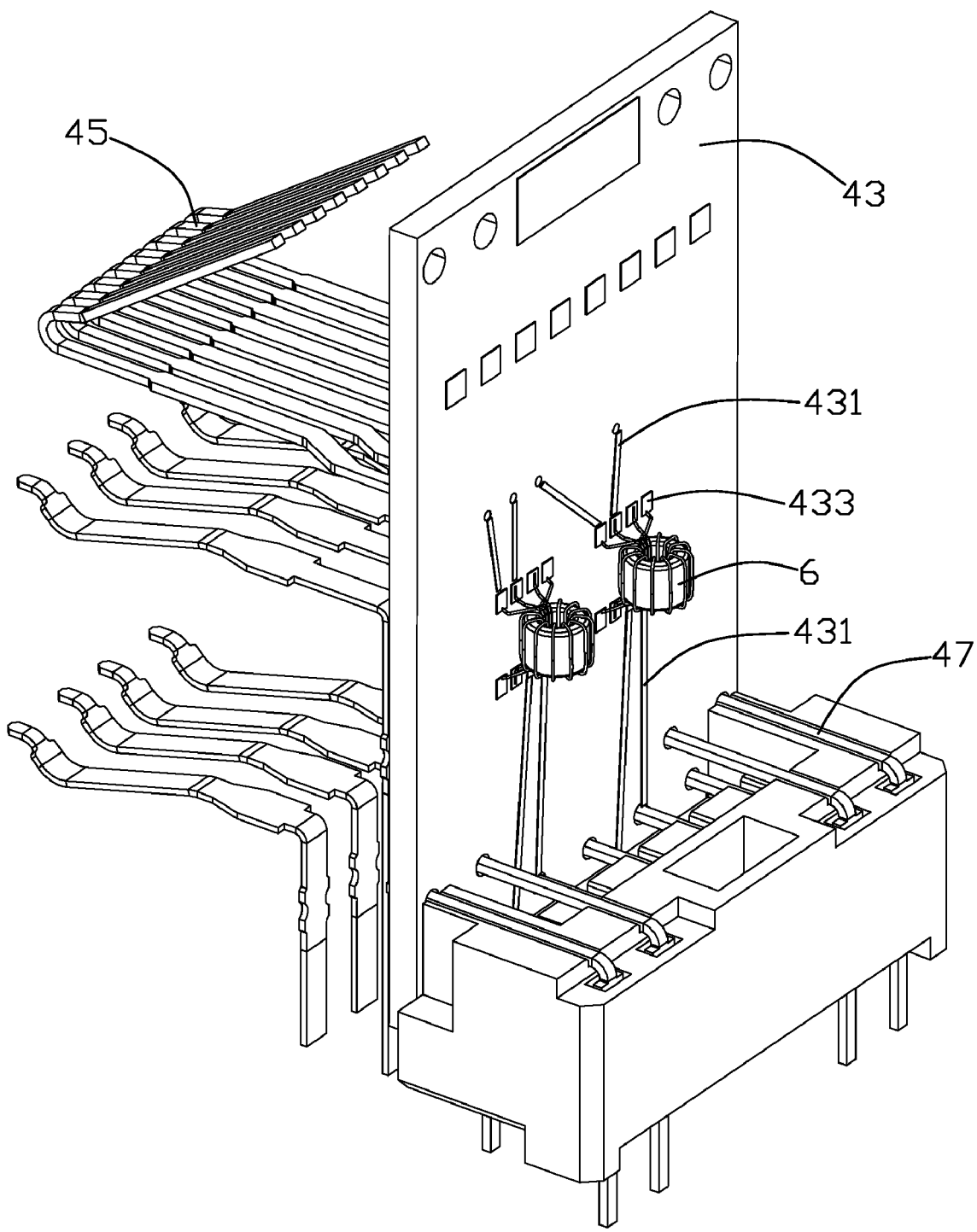
FIG. 9 is a perspective view of a filter portion shown in FIG. 8.

Referring to FIGS. 7-9, an electrical connector system according to a third embodiment of the present invention is shown. The electrical connector system comprises a substrate 2 forming a plurality of conductive traces 21 and an electrical connector 4 mounted on the substrate 2, a transformer 6 and a common mode filter 8. The transformer 6 further comprises a first wire 61 having two opposite ends electrically connected to the Cable side and a second wire 63 having two opposite ends. The common mode filter 8 has a third wire 83 and a fourth wire 85 that are physically separated from the second wire 63. The third wire 83 has an end electrically connected to one end of the second wire 63 and an opposite end electrically connected to the PHY side. The fourth wire 85 has an end electrically connected to the opposite end of the second wire 63 and an opposite end electrically connected to the PHY side. So PHY side and the Cable side are completely opposite to circuit diagram shown in FIG. 12A.

The common mode filter 8 further comprises a plastic container 81, a magnetic core received in the plastic container 81 and a plurality of conductive tails 87 molded together with the plastic container 81. The third wire 83 and the fourth wire 85 wind around the magnetic core. The ends of the third and the fourth wires 83,85 are respectively electrically connected to said conductive tails 87. So, the container 81 makes the common mode filter an integrated common mode module to be assembled conveniently.

Referring to FIGS. 8 and 9, the substrate 2 comprises a plurality of conductive traces 21 and a plurality of conductive pads 23. The common mode module 8 is mounted on the substrate 2. The electrical connector 4 further comprises an interior PCB 43. The interior PCB 43 forms a plurality of conductive traces 431 and a plurality of conductive pads 433. The transformer 6 is mounted on the interior PCB 43. The electrical connector 4 further comprises a plurality of mating contacts 45 and a plurality of transferring contacts 47 mounted on the interior PCB.

Figure 10:
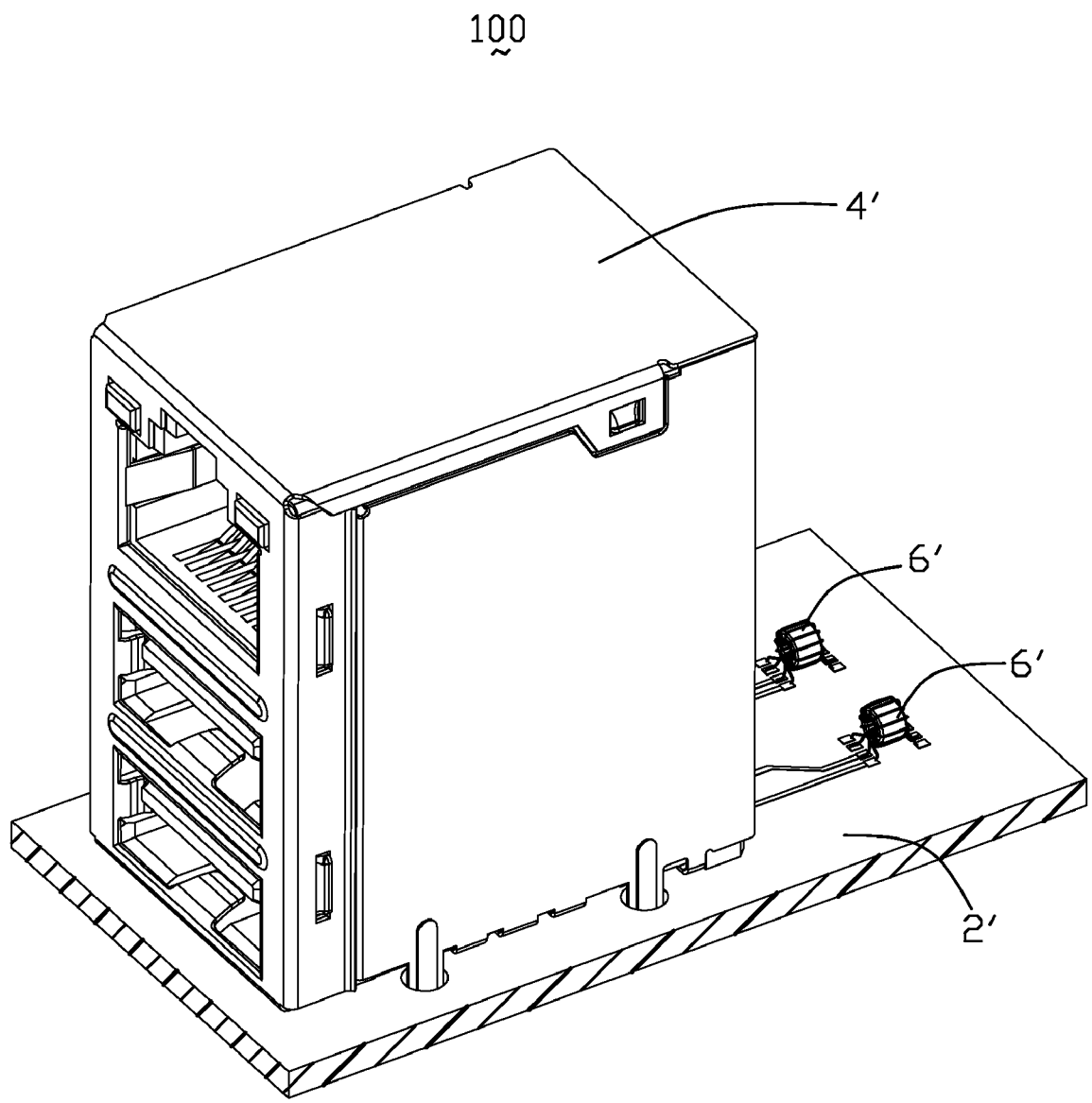
FIG. 10 is a perspective view of an electrical connector system of according to a fourth embodiment of the present invention.
Figure 11:
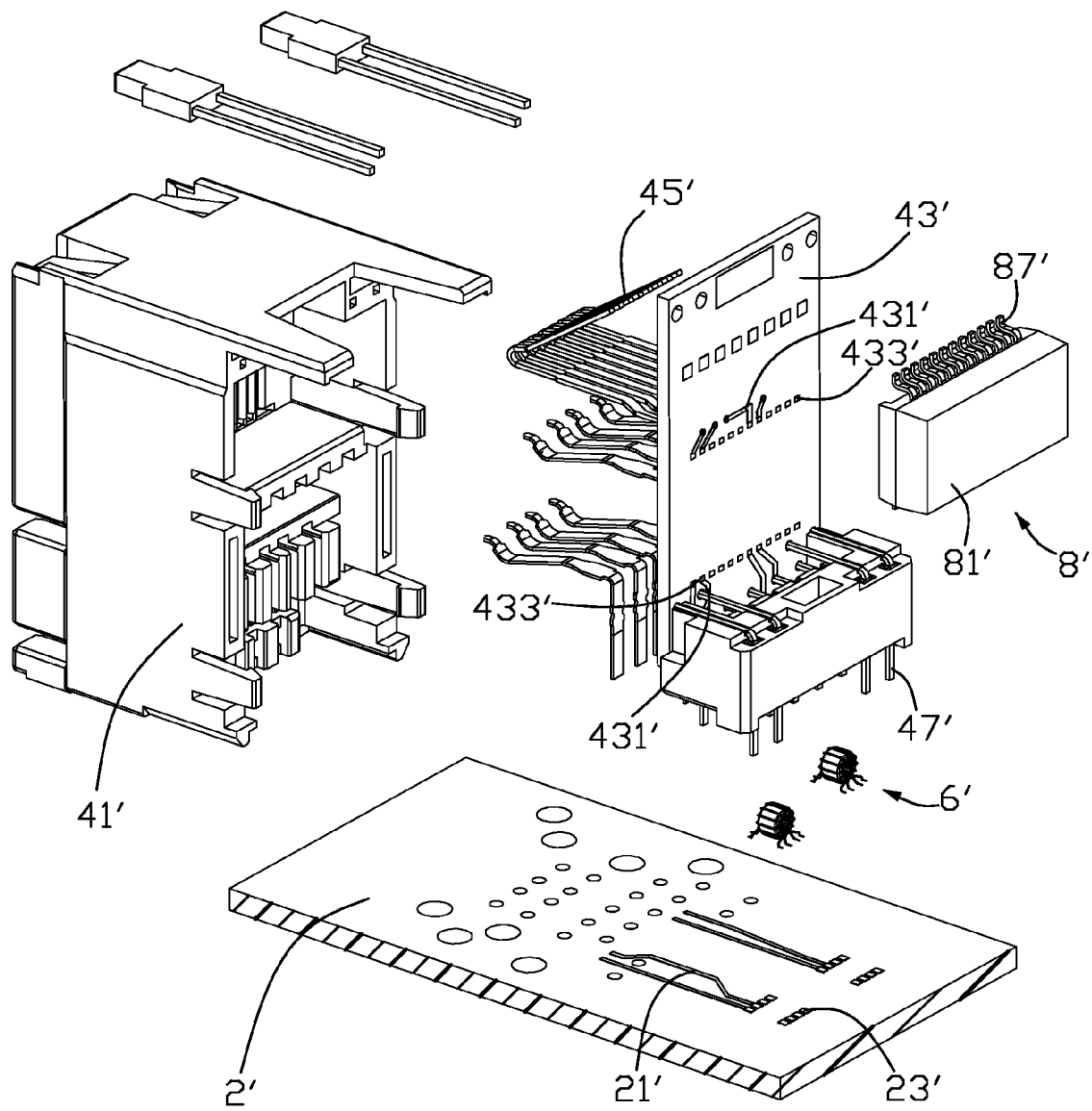
FIG. 11 is an exploded view of the electrical connector system shown in FIG. 10.

Referring to FIGS. 10-11, an electrical connector system according to a fourth embodiment of the present invention is shown. The electrical connector system comprises a substrate 2' forming a plurality of conductive traces 21' and an electrical connector 4' mounted on the substrate 2', a transformer 6' and a common mode filter 8'. The transformer 6' further comprises a first wire 61' having two opposite ends electrically connected to the PHY side and a second wire 63' having two opposite ends. The common mode filter 8' has a third wire 83' and a fourth wire 85' that are physically separated from the second wire 63'. The third wire 83' has an end electrically connected to one end of the second wire 63' and an opposite end electrically connected to the Cable side. The fourth wire 85' has an end electrically connected to the opposite end of the second wire 63' and an opposite end electrically connected to the Cable side. The circuit diagram of the fourth embodiment is shown in FIG. 12B.

The common mode filter 8' further comprises a plastic container 81', a magnetic core received in the plastic container 81' and a plurality of conductive tails 87' molded together with the plastic container 81'. The third wire 83' and the fourth wire 85' wind around the magnetic core. The ends of the third and the fourth wires 83', 85' are respectively electrically connected to said conductive tails 87'. So, the container 81' makes the common mode filter an integrated common mode module to be assembled conveniently.

Referring to FIG. 11, the transformer 6' is mounted on the substrate 2'. The electrical connector 4' further comprises an interior PCB 43'. The interior PCB 43' forms a plurality of conductive traces 431' and a plurality of conductive pads 433'. The common mode filter 8' is mounted on the interior PCB 43'. The electrical connector 4' further comprises a plurality of mating contacts 45' and a plurality of transferring contacts 47' mounted on the interior PCB.

Referring back to the third and fourth embodiments of the present invention, the opposite ends of the second wire 63, 63' and the one ends of the third and the fourth wires are respectively electrically connected through some of the conductive pads 433, 433' and conductive traces 431, 431' of the interior PCB 43, 43', the transferring contacts 47, 47', some of the conductive traces 21, 21' and conductive pads 23, 23' of the substrate 2, 2'. According to the first to the fourth embodiments of the present invention, the second wire 53, 53', 63, 63' of the transformer 5, 5', 6, 6' is physically separated from the wires of the common mode filter 7, 7', 8, 8', so that the transformer 5, 5', 6, 6' and the common mode filter 7, 7', 8, 8' could be separately manufactured conveniently. Furthermore, the common mode filter 7, 7', 8, 8' and the transformer 5, 5', 6, 6' could be optionally mounted onto the substrate 1, 1', 2, 2' or the interior PCB 33, 33', 43, 43'.

Referring to FIGS. 13-16, four electrical connector systems according to fifth to eighth embodiments of the present invention are respectively shown, wherein transformers 300 and common mode filters can be seen. The four electrical connector systems are designed with similar structures to the first to fourth embodiments of the present invention except that the common mode filter is differently designed. The common mode filter of the fifth to eighth embodiments comprises a I-shaped magnetic core 400, a third wire and a fourth wire winding around said magnetic core 400 and a plurality of conductive pads 407 attached to the I-shaped magnetic core 400 and electrically connected to the third and the fourth wires. The I-shaped magnetic core 400 forms opposite protrusions 403 at opposite ends so that the third and the fourth wires could be conveniently wound there around. The conductive pads 407 are so arranged that the common mode filter can be conveniently mounted onto the interior PCB 30 or the substrate 40 by Surface Mounted Technology (SMT).

Figure 17:
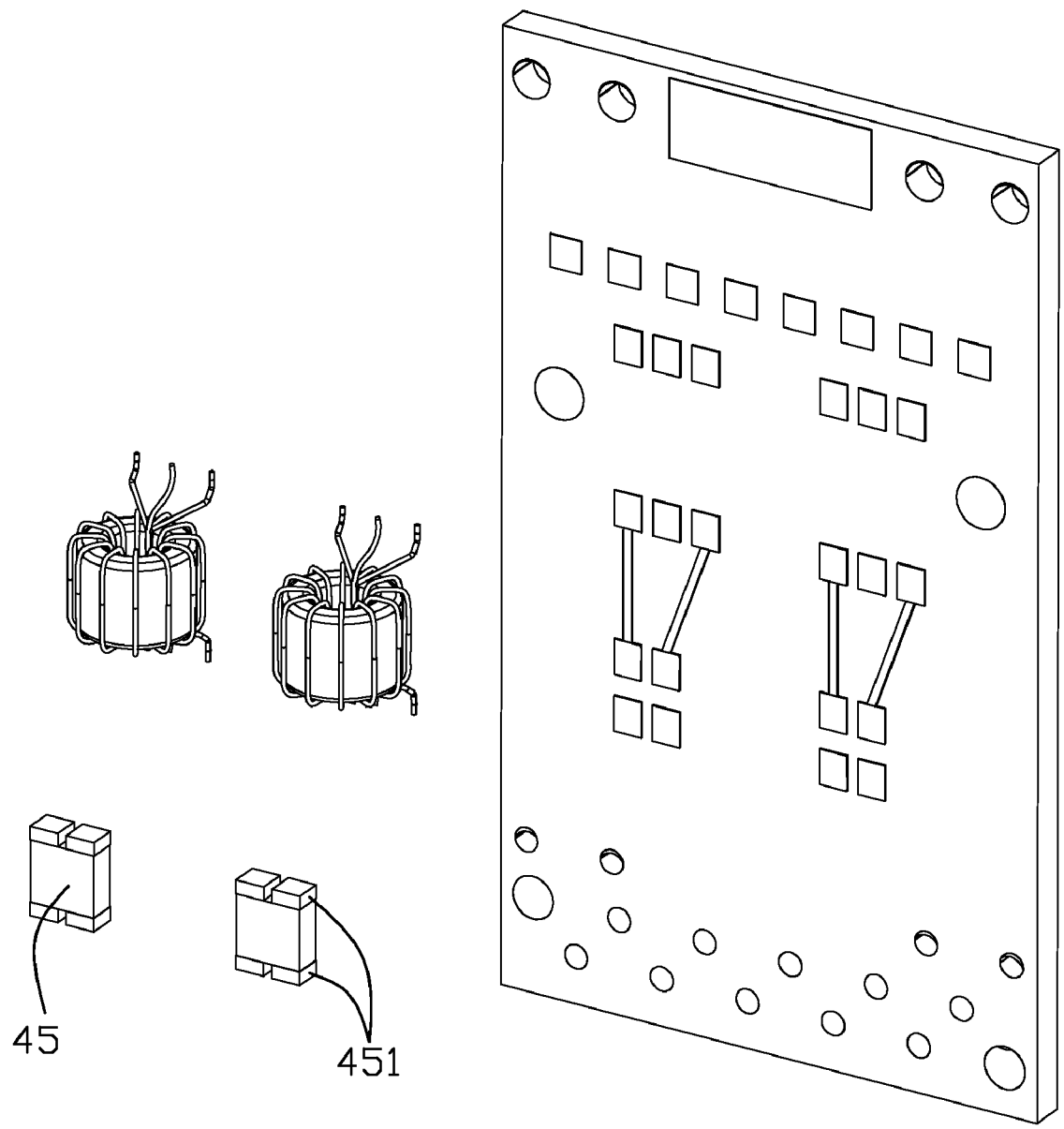
FIG. 17 is a perspective view of a filter portion according to a ninth embodiment of the present invention.

Referring to FIG. 17, an electrical connector system according to a ninth embodiment of the present invention is shown. The structure of the ninth embodiment is similar to the structure of the fifth embodiment except that the common mode filter is replaced with another kind of surface mounting filter 45. The filter 45 comprises of a plurality of solder pads 451 so that the filter could be mounted through Surface-Mount Technology. The filter is a general product and could get from CMM21T serial magnetic products of CHILISIN ELECRONICS CORP.

It is to be understood, however, that even though numerous, characteristics and advantages of the present invention have been set fourth in the foregoing description, together with details of the structure and function of the invention, the disclosed is illustrative only, and changes may be made in detail, especially in matters of number, shape, size, and arrangement of parts within the principles of the invention to the full extent indicated by the broad general meaning of the terms in which the appended claims are expressed.

We claim:

1. An electrical connector system used for a network interface, said network interface providing signal channels between a first side and a second side, said electrical connector system comprising an electrical connector, the electrical connector further comprising:
    an electrical connector housing;
    a transformer having a first wire having two opposite ends electrically connected to said first side and a second wire having two opposite ends;
    a common mode filter having a third wire and a fourth wire that are physically separated from the second wire, the common mode filter further comprises a plurality of terminals, the ends of the third wire and the fourth wire being respectively connected to the plurality of the terminals;
    an interior PCB mounted inside the electrical connector housing, the interior PCB having a plurality of conductive pads and a plurality of conductive traces connecting the conductive pads;
    a plurality of mating contacts connected to the interior PCB and acting as one of the first and second sides;
    a plurality of transferring contacts connected to the interior PCB and acting as other of the first and second sides;
    wherein the transformer and the common mode filter are mounted onto the interior PCB with the terminals of the common mode filter soldered onto corresponding conductive pads;
    wherein the third wire has an end electrically connected to one end of the second wire and an opposite end electrically connected to corresponding transferring contact through corresponding terminal, conductive pad and conductive trace of the interior PCB, and wherein the fourth wire has an end electrically connected to the opposite end of the second wire and an opposite end electrically connected to corresponding transferring contact through corresponding terminal, conductive pad and conductive trace of the interior PCB.

2. An electrical connector system according to claim 1, wherein the electrical connector having a front mating port for horizontally receiving a cable end connector therein, the interior PCB being vertically received the electrical connector, the mating contacts being mounted onto a front side of the interior PCB, and the transformer, the common mode filter and the transferring contacts are mounted onto a back side of the interior PCB.

3. An electrical connector system according to claim 1, wherein the common mode filter further comprises a magnetic core, the third wire and the fourth wire winding around said magnetic core to form a common mode module for filtering common noise in corresponding signal channel.

4. An electrical connector system according to claim 3, wherein the common mode module further comprises a housing defining a cavity for receiving the magnetic core, the third and the fourth wires, the terminals being formed into conductive tails extending out from the housing, the ends of the third and the fourth wires being respectively electrically connected to said conductive tails.

5. An electrical connector system according to claim 1, wherein each signal channel comprises a same structure and the common mode filter of each channel has a separated magnetic core.

6. An electrical connector system according to claim 5, wherein the magnetic core of the common mode filter are formed in an I-shape, the third and the fourth wires winding around said magnetic core to form a common mode module for filtering common noise in corresponding signal channel, and the filter further comprises a plurality of conductive pads for being surface mounted on said interior PCB.

7. An electrical connector system used for a network interface, said network interface providing signal channels between a cable side for mating with a cable end connector and an opposite physical side, said electrical connector system comprising:
 a substrate forming a plurality of conductive traces and a plurality of conductive pads connected by the conductive traces;
 an electrical connector mounted on the substrate; wherein the electrical connector further comprises:
 an interior PCB forming a plurality of conductive traces;
 a transformer mounted on the substrate having a first wire and a coupled second wire electrically connected to some of the conductive pads of the substrate;
 a common mode filter mounted onto the substrate and having a plurality of terminals, a third wire and a fourth wire having opposite ends respectively connected to the plurality of the terminals, the terminals being connected to some other conductive pads of the substrate;
 a plurality of transferring contacts connecting the interior PCB to the substrate;
 a plurality of mating contacts acting as the cable side and electrically connected to opposite ends of the first wire through the conductive traces of the interior PCB, the transferring contacts and the substrate;
 wherein the third wire has an end electrically connected to one end of the second wire and an opposite end electrically connected to said second physical side through some of the conductive traces of the substrate, and the fourth wire has an end electrically connected to the opposite end of the second wire and an opposite end electrically connected to said physical side through some other of the conductive traces of the substrate.

8. An electrical connector system according to claim 7, wherein the common mode filter has an I-shaped magnetic core, and the terminals of the common mode filter are formed into a plurality of conductive pads disposed on a bottom face of the magnetic core and respectively connected to opposite ends of the third and fourth wire.

9. An electrical connector system according to claim 7, wherein the common mode module further comprises a housing defining a cavity for receiving the magnetic core, the third and the fourth wires, the terminals being formed into conductive tails extending out from the housing.

10. An electrical connector system used for a network interface, said network interface providing signal channels between a first side and a second side, said electrical connector system comprising:
 a substrate forming a plurality of conductive traces and a plurality of conductive pads connected by the conductive traces;
 an electrical connector mounted on the substrate, the electrical connector further comprising:
 an interior PCB having a plurality of conductive traces and a plurality of conductive pads connected by the conductive traces;
 a plurality of mating contacts acting as the first side of the signal channel and electrically connected to a first number of the conductive traces of the interior PCB;
 a transformer mounted onto the interior PCB and having a first wire having two opposite ends electrically connected to a first number of the conductive pads of the interior PCB thereby electrically connecting to the first side, and a second wire having two opposite ends electrically connected to a second number of the conductive pads of the interior PCB;
 a plurality of transferring contacts connected between the interior PCB and the substrate thereby electrically connecting the second number of conductive pads of the interior PCB to a first number of the conductive pads of the substrate;
 a common mode filter mounted onto the substrate and having a plurality of terminals, a third wire and a fourth wire having one ends connected to the first number of conductive pads of the substrate through a first number of the terminals and opposite ends connected to a second number of the conductive pads of the substrate through a second number of the terminals.

11. An electrical connector system according to claim 10, wherein said ends of the first and the second wires being directly soldered onto said conductive pads of the interior PCB.

12. An electrical connector system according to claim 11, wherein the common mode module further comprises a housing defining a cavity for receiving the magnetic core, the third and the fourth wires, the terminals being formed into conductive tails extending out from the housing.

13. An electrical connector system according to claim 12, wherein the electrical connector having a front mating port for horizontally receiving a cable end connector therein, the interior PCB being vertically received the electrical connector, the mating contacts being mounted onto a front side of the interior PCB, and the transformer, the common mode filter and the transferring contacts are mounted onto a back side of the interior PCB.

14. An electrical connector system according to claim 12 comprising a plurality of signal channels, each signal channel comprising a same structure and the common mode filter of each channel has a separated magnetic core.

15. An electrical connector system according to claim 12, wherein the magnetic core of the common mode filter are formed in an I-shape, the third and the fourth wires winding around said magnetic core to form a common mode module for filtering common noise in corresponding signal channel, and the filter further comprises a plurality of conductive pads for being surface mounted onto the substrate.

* * * * *